United States Patent
Kim et al.

(10) Patent No.: US 10,324,785 B2
(45) Date of Patent: Jun. 18, 2019

(54) DECODER USING LOW-DENSITY PARITY-CHECK CODE AND MEMORY CONTROLLER INCLUDING THE SAME

(71) Applicant: Samsung Electronics Co., Ltd., Suwon-si, Gyeonggi-do (KR)

(72) Inventors: Sung-Rae Kim, Seoul (KR); Gyu Yeol Kong, Yongin-si (KR); Ki Jun Lee, Seoul (KR); Jun Jin Kong, Yongin-si (KR); Hong Rak Son, Anyang-si (KR); Beom Kyu Shin, Seongnam-si (KR); Heon Hwa Cheong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 9 days.

(21) Appl. No.: 15/652,521

(22) Filed: Jul. 18, 2017

(65) Prior Publication Data

US 2018/0024879 A1    Jan. 25, 2018

(30) Foreign Application Priority Data

Jul. 19, 2016 (KR) ................. 10-2016-0091397

(51) Int. Cl.
| | |
|---|---|
| *G06F 11/10* | (2006.01) |
| *G11C 29/52* | (2006.01) |
| *H03M 13/00* | (2006.01) |
| *H03M 13/11* | (2006.01) |
| *H03M 13/37* | (2006.01) |

(52) U.S. Cl.
CPC ...... *G06F 11/1068* (2013.01); *G06F 11/1012* (2013.01); *H03M 13/1111* (2013.01); *H03M 13/3723* (2013.01); *H03M 13/6325* (2013.01); *G11C 29/52* (2013.01)

(58) Field of Classification Search
CPC .......... G06F 11/1068; H03M 13/3723; H03M 13/6325; H03M 13/1111; G11C 29/52
See application file for complete search history.

(56) References Cited

U.S. PATENT DOCUMENTS

| | | | |
|---|---|---|---|
| 7,137,060 | B2 | 11/2006 | Yu et al. |
| 7,237,181 | B2 | 6/2007 | Richardson |
| 7,401,283 | B2 | 7/2008 | Shen et al. |

(Continued)

FOREIGN PATENT DOCUMENTS

JP    2013207358 A    10/2013

*Primary Examiner* — Thien Nguyen
(74) *Attorney, Agent, or Firm* — Harness, Dickey & Pierce, P.L.C.

(57) ABSTRACT

A decoder includes a channel mapper configured to generate a plurality of channel reception values based on hard decision information and soft decision information, a strong error detector configured to determine whether a strong error has occurred using a plurality of check node messages and the channel reception values and to correct the channel reception values according to a determination result to produce corrected channel reception values, a variable node unit configured to generate a plurality of variable node messages using the check node messages and the corrected channel reception values, and a check node unit configured to generate the check node messages using the variable node messages. The variable node unit includes a plurality of variable nodes and the check node unit includes a plurality of check nodes.

19 Claims, 12 Drawing Sheets

(56) References Cited

U.S. PATENT DOCUMENTS

| | | |
|---|---|---|
| 8,020,078 B2 | 9/2011 | Richardson |
| 8,245,115 B2 | 8/2012 | Savin et al. |
| 8,316,272 B2 | 11/2012 | Gunnam |
| 8,327,235 B2 | 12/2012 | Gunnam |
| 8,504,895 B2 | 8/2013 | Sharon et al. |
| 8,781,033 B2 | 7/2014 | Han et al. |
| 8,935,600 B1 | 1/2015 | Varnica et al. |
| 9,009,574 B2 | 4/2015 | Chilappagari et al. |
| 9,015,548 B2 | 4/2015 | Sakaue |
| 9,118,348 B2 | 8/2015 | Maeto |
| 9,130,590 B2 | 9/2015 | Liu et al. |
| 9,184,767 B2 | 11/2015 | Vernon |
| 9,231,619 B2 | 1/2016 | Zeng et al. |
| 2005/0262420 A1* | 11/2005 | Park .................. H03M 13/1137 714/758 |
| 2009/0319860 A1 | 12/2009 | Sharon et al. |
| 2013/0124940 A1* | 5/2013 | Yang .................. H03M 13/1108 714/755 |
| 2014/0082449 A1 | 3/2014 | Zhang |
| 2014/0229788 A1 | 8/2014 | Richardson |
| 2014/0298131 A1 | 10/2014 | Chen et al. |
| 2015/0303944 A1 | 10/2015 | Sunwoo et al. |
| 2015/0349800 A1* | 12/2015 | Lin .................... H03M 13/1111 714/758 |
| 2015/0372695 A1 | 12/2015 | Li et al. |

\* cited by examiner

DECODER USING LOW-DENSITY PARITY-CHECK CODE AND MEMORY CONTROLLER INCLUDING THE SAME

CROSS-REFERENCE TO RELATED APPLICATIONS

This application claims priority under 35 U.S.C. § 119(a) from Korean Patent Application No. 10-2016-0091397 filed on Jul. 19, 2016, the disclosure of which is hereby incorporated by reference in its entirety.

BACKGROUND

Example embodiments of the inventive concepts relate to a decoder using a low-density parity-check (LDPC) code and/or a memory controller including the same.

In the field of semiconductor memory, errors occurring due to noise may be corrected using coding and decoding technology based on error correction codes. Among these error correction codes, the LDPC code which uses an iterative operation based on a probability has received attention.

A strong error may occur in a NAND flash memory device, where the strong error is an error which makes a large value allocated to an absolute value of a channel log-likelihood ratio (LLR) of a decoder because of its high degree of interference among errors occurring due to interference between the program states of adjacent cells. The strong error may significantly deteriorate the error correction performance of the decoder using the LDPC code. In a NAND flash memory device having a high strong error ratio, the correction performance of an LDPC decoder may greatly decrease.

SUMMARY

According to some example embodiments of the inventive concepts, a decoder may include a channel mapper configured to generate a plurality of channel reception values based on hard decision information and soft decision information; and a strong error detector configured to, determine whether a strong error is present using a plurality of check node messages and the channel reception values, and correct the channel reception values to produce corrected channel reception values, if the strong error detector detects that the strong error is present According to other example embodiments of the inventive concepts, a memory controller may include a decoder configured to program data to a memory device and a central processing unit (CPU). The decoder may include a channel mapper configured to generate a plurality of channel reception values based on hard decision information and soft decision information, and a strong error detector configured to, determine whether a strong error is present using a plurality of check node messages and the channel reception values, and to correct the channel reception values to produce corrected channel reception values, if the strong error is present. The CPU may be configured to instruct the strong error detector to operate in one of a first mode and a second mode, the first mode being a mode in which the strong error detector performs correction and the second mode being a mode in which the strong error detector does not perform the correction.

According to other example embodiments of the inventive concepts, a decoder may include processing circuitry configured to, detect a strong error node among a plurality of variable nodes, each the plurality of variable nodes having a channel reception value associated therewith, and correct the channel reception value associated with the strong error node.

BRIEF DESCRIPTION OF THE DRAWINGS

The above and other features and advantages of the example embodiments of the inventive concepts will become more apparent by describing in detail some example embodiments thereof with reference to the attached drawings in which.

DETAILED DESCRIPTION

Figure 1:
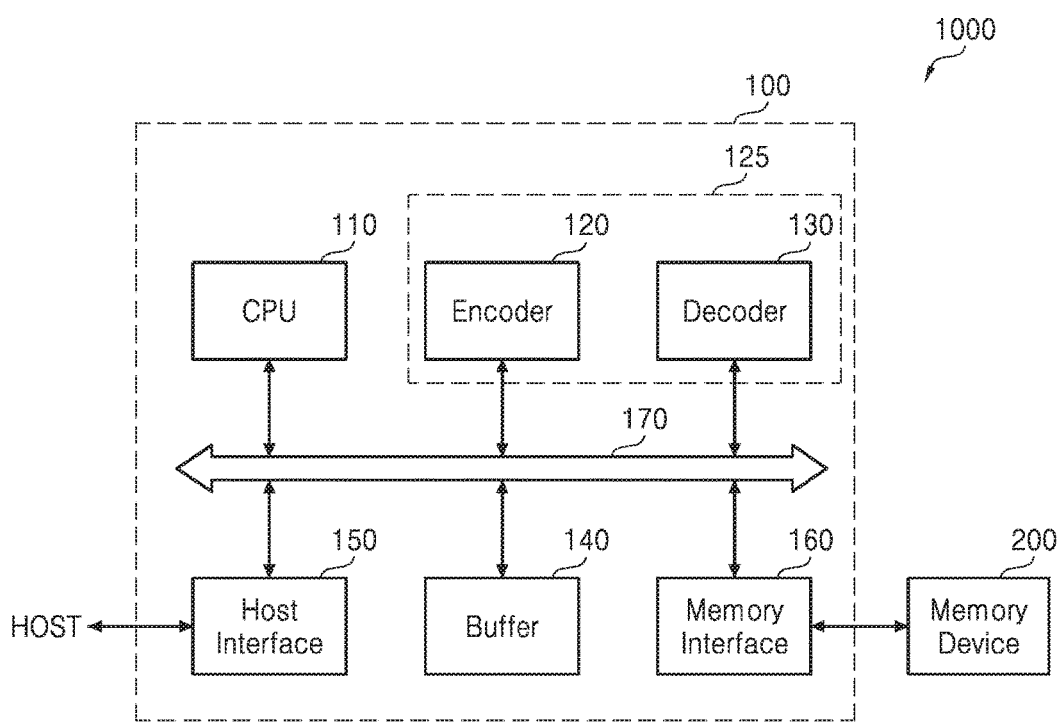
FIG. 1 is a block diagram of a memory system according to some example embodiments of the inventive concepts.

Example embodiments of the inventive concepts now will be described more fully hereinafter with reference to the accompanying drawings, in which some example embodiments are shown. These example embodiments may, however, be embodied in many different forms and should not be construed as limited to the example embodiments set forth herein. Rather, these example embodiments are provided so that this disclosure will be thorough and complete, and will fully convey the scope of the example embodiments to those skilled in the art. In the drawings, the size and relative sizes of layers and regions may be exaggerated for clarity. Like numbers refer to like elements throughout.

FIG. 1 is a block diagram of a memory system 1000 according to some example embodiments of the inventive concepts.

Referring to FIG. 1, the memory system 1000 includes a memory controller 100 and a memory device 200. The memory controller 100 may include a central processing unit (CPU) 110, an error correction code (ECC) block 125, a buffer 140, a host interface 150, a memory interface 160, and a bus 170. The ECC block 125 may include an encoder 120 and a decoder 130.

The CPU 110 may be electrically connected with the encoder 120, the decoder 130, the buffer 140, the host interface 150, and the memory interface 160 through the bus 170.

The CPU 110 may control the overall operation of the memory system 1000. For example, the CPU 110 may read a command received from a host and may control the memory system 1000 to operate according to the result of reading the command. The CPU 110 may provide a read command and an address for the memory device 200 during a read operation. The CPU 110 may also provide a write command, an address, and an encoded codeword for the memory device 200 during a write operation.

The CPU 110 may output a control signal (e.g., a detection control signal DC) for controlling the operation of the decoder 130 to the decoder 130. The details will be described later. The CPU 110 may translate a logical address received from a host into a physical page address using meta data stored in the buffer 140. After power-on of the memory system 1000, the CPU 110 may control the memory system 1000 to read the meta data from the memory device 200 and to store the meta data in the buffer 140. The CPU 110 may control the memory system 1000 to update the meta data in the buffer 140. The CPU 110 may control the memory system 1000 to write the meta data stored in the buffer 140 to the memory device 200 before the memory system 1000 is powered off.

The CPU 110 may include at least one processor implemented by at least one semiconductor chip disposed on a printed circuit board. The processor may be an arithmetic logic unit, a digital signal processor, a microcomputer, a field programmable array, a programmable logic unit, a microprocessor or any other device capable of responding to and executing instructions in a defined manner.

In some example embodiments, the CPU 110 may be programmed with instructions that configure the CPU 110 perform the functions of the ECC block 125. For example, in some example embodiments, the CPU 110 may be programmed with instructions that configure the CPU 110 as a special purpose computer to perform, during a write operation, low-density parity-check (LDPC) encoding of information word received from a host, and perform, during a read operation, LDPC decoding of data read from the memory device 200.

In other example embodiments, the ECC block 125 and the elements therein may be discrete hardware circuitry, such as an application-specific integrated circuit (ASIC) designed to perform the LDPC encoding and LDPC decoding.

During a write operation, the CPU 110 may control the memory system 1000 to perform low-density parity-check (LDPC) encoding of information word, which has been received from a host, in the encoder 120. During a read operation, the CPU 110 may control the memory system 1000 to perform LDPC decoding of data read from the memory device 200, in the decoder 130.

The ECC block 125 may encode data received from the host and may decode data read from the memory device 200.

The encoder 120 may attach a plurality of parity bits specified by an LDPC code to an information word received from a host to generate a codeword. When the number of bits in the codeword is N and the number of bits in the information word is K, the number of parity bits is "N−K". Each parity bit in the LDPC codeword may be set to satisfy the LDPC code.

The decoder 130 may perform LDPC decoding on each codeword in data read from the memory device 200 to restore an information word. A codeword may be a page, which may include "i" bits, where "i" is a natural number.

The decoder 130 may allow messages to be exchanged between the variable node and check nodes. The decoder 130 may perform LDPC decoding based on scheduling information. The scheduling information may include information representing an order of exchanging messages between the check nodes and the variable nodes for LDPC decoding. The scheduling information is determined by manipulating either an order of the check nodes or an order of the variable nodes in an LDPC bipartite graph so that memory access collision and read-before-write violation are prevented. The structure and operations of the decoder 130 will be described in detail later.

The buffer 140 may temporarily store an information word received from the host, a signal and data generated by the CPU 110, or data (e.g., a codeword) read from the memory device 200. The buffer 140 may also store the meta data read from the memory device 200 and store the LDPC scheduling information read from the memory device 200.

The buffer 140 may be formed of dynamic random access memory (DRAM) or static RAM (SRAM).

The meta data is generated in the memory system 1000 to manage the memory device 200. The meta data is management information and may include mapping table information used to translate a logical address into a physical page address (PPA) of the memory device 200. The meta data may include page mapping table information used to perform an address mapping process. In addition, the meta data may include information used to manage the storage space of the memory device 200.

The host interface 150 may be configured to utilize a protocol for data exchange with the host. The host interface 150 may be connected with the host. The host interface 150 may be implemented as an advanced technology attachment (ATA) interface, a serial ATA (SATA) interface, a parallel ATA (PATA) interface, a small computer system interface (SCSI), a serial attached SCSI (SAS), a universal serial bus (USB) interface, an embedded multimedia card (eMMC) interface, or a Unix file system (UFS) interface. However, example embodiments of the inventive concepts are not restricted to these examples. In detail, the host interface 150 may exchange commands, addresses, and data with the host according to the control of the CPU 110.

The memory interface 160 may be connected with the memory device 200. The memory interface 160 may support interface with a NAND flash memory chip or a NOR flash memory chip. The memory interface 160 may selectively perform software and hardware interleaving operations through a plurality of channels.

The bus 170 may be a transmission line through which information is transferred among the elements 110, 120, 130, 140, 150, and 160 of the memory controller 100.

Although not shown in FIG. 1, the memory controller 100 may also include a read threshold generator. The read threshold generator may generate a plurality of read thresholds, which may be used to read the memory device 200.

The memory device 200 may be implemented as a non-volatile memory device such as a flash memory device, a phase-change RAM (PRAM) device, a ferroelectric RAM (FRAM) device, or a magnetic RAM (MRAM) device. The memory device 200 may include at least one of a non-volatile memory device and a volatile memory device or may include at least two different types of non-volatile memory devices. The memory device 200 may be formed of a single flash chip or a plurality of flash memory chips.

Figure 2:
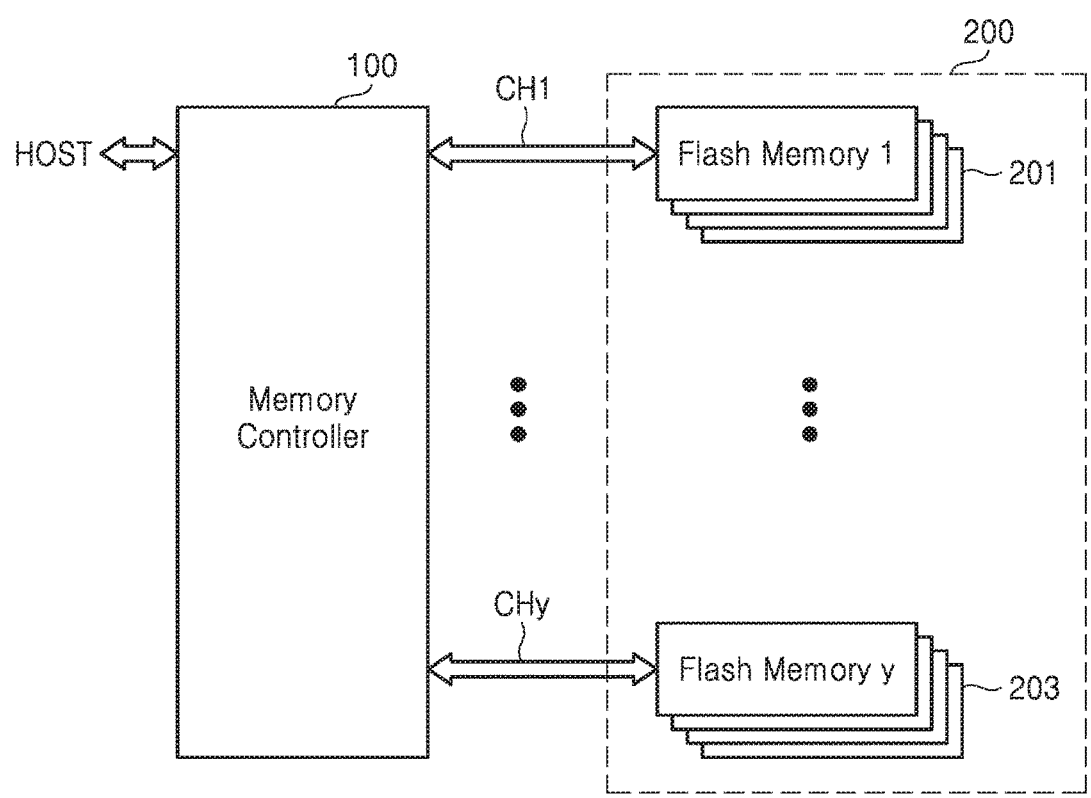
FIG. 2 is a block diagram of a memory system including a plurality of channels according to some example embodiments of the inventive concepts.

FIG. 2 is a block diagram of a memory system including a plurality of channels according to some example embodiments of the inventive concepts.

Referring to FIG. 2, the memory device 200 may be implemented as a solid state drive (SSD), which may also be called a solid state disc. Referring to FIG. 2, the memory device 200 includes a plurality of flash memory chips 201 and 203.

Referring to FIGS. 1 and 2, the memory system 1000 may include "y" channels, where "y" is a natural number. Although four flash memory chips are assigned for each of a plurality of channels CH1 through CHy in the example embodiment illustrated in FIG. 2, the example embodiments of the inventive concepts are not restricted thereto. For example, the number of flash memory chips assigned for a channel may be changed.

The structure of the memory controller 100 illustrated in FIG. 2 may substantially be the same as that of the memory controller 100 illustrated in FIG. 1. Thus, the description of the memory controller 100 will be omitted to avoid redundancy.

Figure 3:
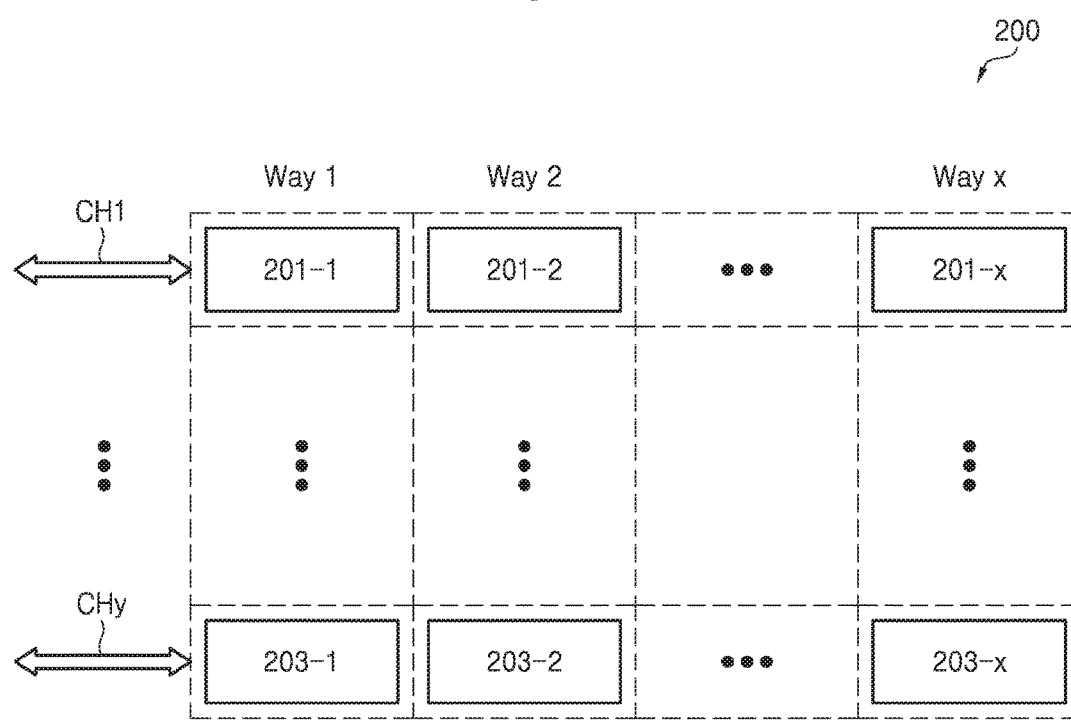
FIG. 3 is a block diagram of a block diagram of the structure of channels and banks in a memory system according to some example embodiments of the inventive concepts.

FIG. 3 is a block diagram of a block diagram of the structure of channels and banks in a memory system according to some example embodiments of the inventive concepts.

Referring to FIG. 3, each of the channels CH1 through CHy may be electrically connected with a plurality of the flash memory chips 201 to 203. Each of the channels CH1 through CHy may be an independent bus which can transmit and receive commands, addresses, and data to and from the corresponding flash memory chips 201 or 203. Accordingly, flash memory chips connected to one channel may operate independently from other memory chips connected to a different channel.

The flash memory chips 201 to 203 may form a plurality of ways WAY1 through WAYx. One of the channels CH1 through CHy may be connected with "x" flash memory chips respectively corresponding to the "x" ways WAY1 through WAYx. For instance, the first channel CH1 may be connected with flash memory chips 201-1 through 201-*x* respectively corresponding to the "x" ways WAY1 through WAYx. Such relationship among flash memory chips, a channel, and ways may also be applied to other ones of the plurality of flash memory chips 201 to 203.

A way is a unit for distinguishing flash memory chips which share one channel from one another. A plurality of flash memory chips 201 to 203 may be distinguished by their channel numbers CH and way numbers WAY. A request from a host will be performed on a flash memory chip a way and channel is determined by a logical address transmitted from the host.

Figure 4:
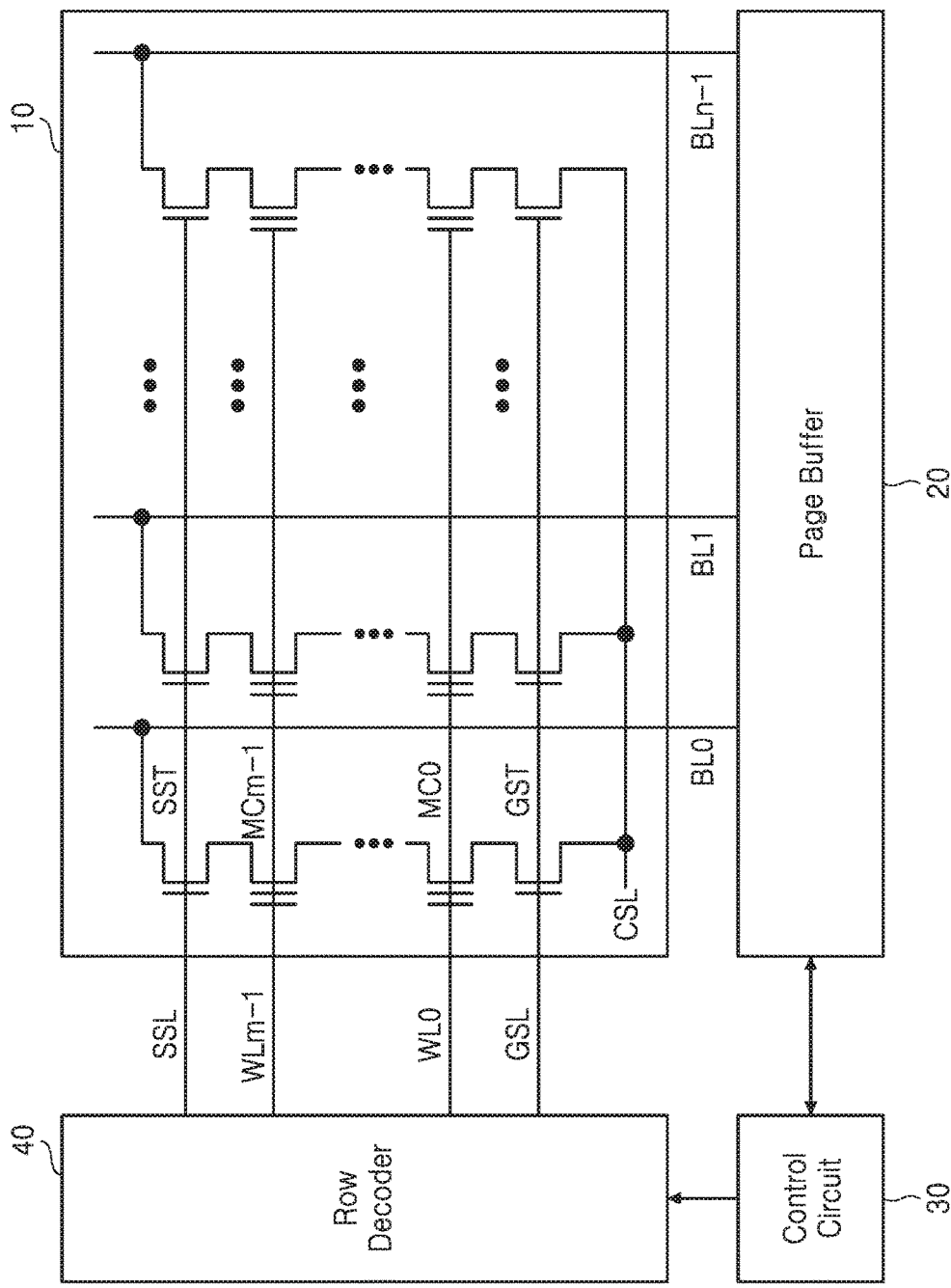
FIG. 4 is a block diagram showing the circuit structure of a flash memory chip included in a memory device according to some embodiments of the inventive concept.

FIG. 4 is a block diagram showing the circuit structure of the flash memory chip 201-1 included in the memory device 200 according to some example embodiments of the inventive concepts.

Referring to FIG. 4, the flash memory chip 201-1 may include a memory cell array 10, a page buffer 20, a control circuit 30, and a row decoder 40.

The memory cell array 10 is an area to which data is written by applying a desired (or, alternatively, a predetermined) voltage to a transistor. The memory cell array 10 may include a plurality of memory cells which store data. The memory cell array 10 may be implemented in a two-dimensional structure or a three-dimensional structure.

The memory cell array 10 may include a three-dimensional memory cell array. The three-dimensional memory cell array may be monolithically formed at one or more physical levels in an array of memory cells having an active region disposed on or above a silicon substrate and may include a circuit involved in the operation of the memory cells. The circuit may be formed in, on or above the silicon substrate. The term "monolithic" means that layers at each level in an array are directly deposited on layers at an underlying level in the array. The three-dimensional memory cell array may include a vertical NAND string which is vertically oriented so that at least one memory cell is placed on or above another memory cell. The at least one memory cell may include a charge trap layer.

The memory cell array 10 may include memory cells formed at intersections between word lines WL0 through WLm−1 and bit lines BL0 through BLn−1, where "m" and "n" are natural numbers. Although one memory block is illustrated in FIG. 4, the memory cell array 10 may include a plurality of memory blocks. Each of the memory blocks includes pages respectively corresponding to the word lines WL0 through WLm−1. Each of the pages includes a plurality of memory cells connected to corresponding one of the word lines WL0 through WLm−1.

The flash memory chip 201-1 may perform an erase operation on each block and may perform a program operation or a read operation on each page. The memory cell array 10 has a cell string structure. A cell string includes a string selection transistor SST connected to a string selection line SSL, memory cells MC0 through MCm−1 respectively connected to the word lines WL0 through WLm−1, and a ground selection transistor GST connected to a ground selection line GSL. The string selection transistor SST is connected between a bit line and a string channel and the ground selection transistor GST is connected between a string channel and a common source line CSL.

The page buffer 20 may be connected to the memory cell array 10 through the bit lines BL0 through BLn−1. The page buffer 20 may temporarily store data to be written to memory cells connected to a selected word line or may temporarily store data read from the memory cells connected to the selected word line.

The control circuit 30 may generate various voltages necessary for the program, read and erase operations and may control the overall operation of the flash memory chip 201-1.

The row decoder 40 may be connected to the memory cell array 10 through the selection lines SSL and GSL and the word lines WL0 through WLm−1. The row decoder 40 may receive an address and select a word line according to the address during a program or read operation. The selected word line may be connected with memory cells on which the program or read operation will be performed. The row decoder 40 may also apply voltages (such as a program voltage, a pass voltage, a read voltage, a string selection voltage, and/or a ground selection voltage) used for the program and read operations to the selected word lines, non-selected word lines, and the selection lines SSL and GSL.

Each memory cell may store 1-bit data or at least 2-bit data. A memory cell which stores data of one bit is called a single level cell (SLC) and a memory cell which stores data of at least two bits is called a multi-level cell (MLC). The SLC has an erase state or a program state according to a threshold voltage.

Figure 5:
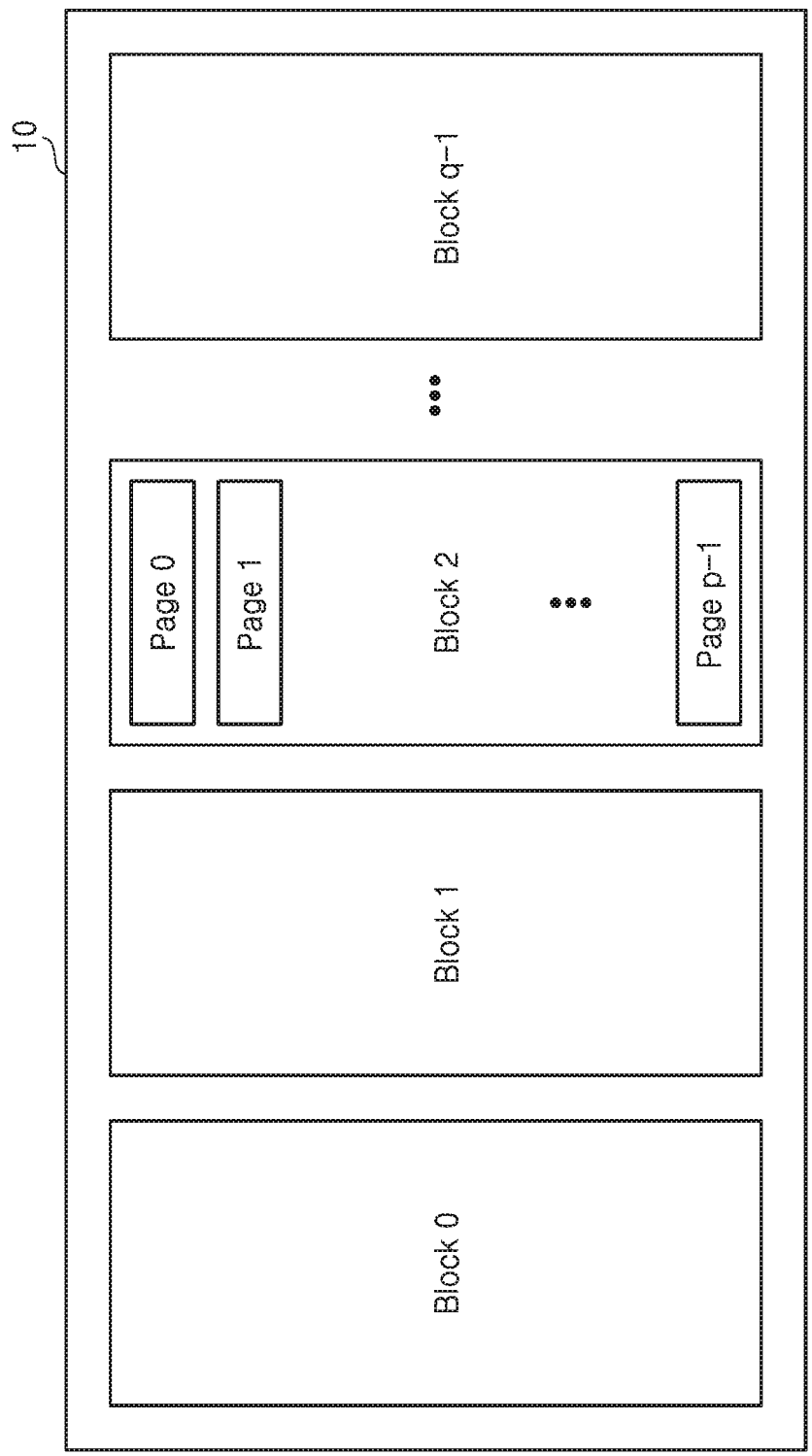
FIG. 5 is a block diagram showing the conceptual structure of a memory cell array according to some example embodiments of the inventive concepts.

FIG. 5 is a block diagram showing the conceptual structure of the memory cell array 10 according to some example embodiments of the inventive concepts.

Referring to FIG. 5, the memory cell array 10 may include a plurality of blocks Block0 through Blockq−1. Each of the blocks Block0 through Blockq−1 may include a plurality of pages Page0 through Pagep−1. Data write operation and data read operation are performed on each page and an electrical erase is performed on each block in the flash memory chip 201-1.

The electrical erase of a block may need to be performed prior to the write operation, such that the memory device cannot perform an overwrite operation. In a memory device in which overwrite is not possible, user data may not be written to a physical area wanted by a user. Accordingly, when an access for a write operation or a read operation is requested from the host, address translation may be used to translate a logical address indicating an area corresponding to the write or read request into a physical page address indicating a physical area where data has been stored or will be stored.

A procedure for translating a logical address into a physical page address in the memory system 1000 will be described with reference to FIG. 6.

Figure 6:
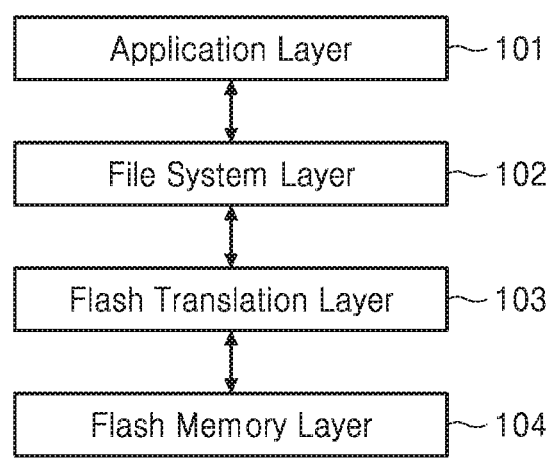
FIG. 6 is a block diagram showing the software structure of the memory system according to some example embodiments of the inventive concepts.

FIG. 6 is a block diagram showing the software structure of the memory system 1000 according to some example embodiments of the inventive concepts. The software structure shown in FIG. 6 appears in a case where the memory device 200 is formed of flash memory.

Referring to FIG. 6, the memory system 1000 has a hierarchical software structure in which an application layer 101, a file system layer 102, a flash translation layer 103, and a flash memory layer 104 are structured from top to bottom. The application layer 101 is firmware which processes user data in response to a user input from the host, and transmits a command for storing the processed user data in a flash memory chip to the file system layer 102.

The file system layer 102 allocates a logical address at which the user data will be stored in response to the command received from the application layer 101. A file allocation table (FAT) file system and a new technology file system (NTFS) are sorts of the file system layer 102.

The flash translation layer 103 translates the logical address received from the file system layer 102 into a physical page address used to perform a read/write operation on a flash memory chip. The flash translation layer 103 may translate the logical address into the physical page address using mapping information included in meta data. Referring to FIGS. 1 and 6, the address translation of the flash translation layer 103 may be performed in the CPU 110 of the memory controller 100.

The flash memory layer 104 may access the physical page address and generate control signals to store or read the data.

Figure 7:
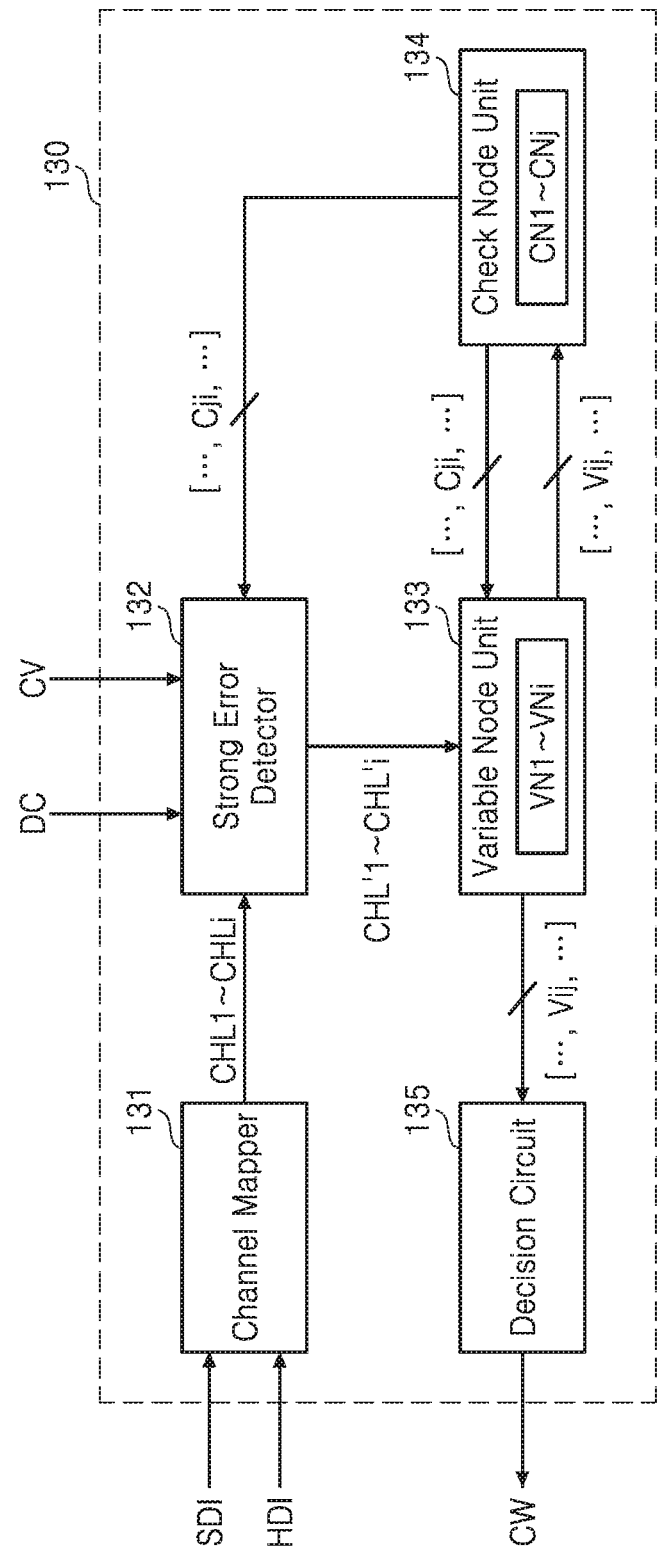
FIG. 7 is a block diagram of a decoder according to some example embodiments of the inventive concepts.

FIG. 7 is a block diagram of the decoder 130 according to some example embodiments of the inventive concepts.

Referring to FIG. 7, the decoder 130 may include a channel mapper 131, a strong error detector 132, a variable node unit 133, a check node unit 134, and a decision unit (or, alternatively, decision circuit) 135. It is assumed that the memory system 1000 is in a read mode to describe the operations of the decoder 130.

As discussed above, In some example embodiments, the CPU 110 may be programmed with instructions that configure the CPU 110 perform the functions of the ECC block 125 including the various elements of the decoder 130. In other example embodiments, the ECC block 125 including the various elements of the decoder 130 may be embodied as discrete hardware circuitry, such as an application-specific integrated circuit (ASIC) designed to perform the LDPC encoding and LDPC decoding.

The channel mapper 131 may receive hard decision information HDI and soft decision information SDI, which have been generated during an initial read operation. The hard decision information HDI or the soft decision information SDI may include hard decision values or soft decision values of a page or segment including "i" cells, where "i" is a natural number. In other words, the hard decision information HDI may include "i" hard decision values and the soft decision information SDI may include "i" soft decision values.

When the memory device 200 includes the single level cells (SLCs), a hard decision value may be 1 or 0. In other example embodiments, the memory device 200 may include the multi-level cells (MLCs) which store at least two bits, for example, triple level cells (TLCs) which store three bits.

The channel mapper 131 may generate a plurality of channel reception values CHL1 through CHLi based on the hard decision information HDI and the soft decision information SDI. The number of the channel reception values CHL1 through CHLi may be "i". Each of the channel reception values CHL1 through CHLi may be expressed as an integer having a size and a sign. For instance, a channel reception value CHL may be a log likelihood ratio (LLR) of a channel.

The sign of the channel reception value CHL may be determined based on the hard decision information HDI. For instance, when the hard decision value of a cell is 0, the sign of the channel reception value CHL may be a positive sign, i.e., "+"; when the hard decision value of a cell is 1, the sign of the channel reception value CHL may be a negative sign, i.e., "−". However, example embodiments of the inventive concepts are not restricted thereto.

The absolute value (i.e., the size) of the channel reception value CHL may be determined based on the soft decision information SDI. According to the soft decision value of a cell, the absolute value of the channel reception value CHL may indicate the certainty or probability of the result of hard decision. The absolute value of the channel reception value CHL may increase when the certainty or probability of the result of hard decision increases. When "b" bits are allocated to express the absolute value of the channel reception value CHL, the absolute value may be one of values belonging to the set of desired (or, alternatively, the predetermined) values, which may be [0, 1, . . . , 2b−1]. For instance, when three bits are allocated to express the absolute value of the channel reception value CHL, the set of desired (or, alternatively, the predetermined) values may be [0, 1, 2, 3, 4, 5, 6, 7].

The channel mapper 131 may output the channel reception values CHL1 through CHLi to the strong error detector 132. Referring to FIGS. 1 and 7, the strong error detector 132 may operate according to the detection control signal DC. The strong error detector 132 may receive the detection control signal DC from the CPU 110.

The CPU 110 may control the strong error detector 132 to operate in either a first mode in which the strong error detector 132 performs correction or a second mode in which the strong error detector 132 does not perform correction.

For instance, the CPU 110 may control the strong error detector 132 to operate in the first mode for a desired (or, alternatively, a predetermined) period of time and then operate in the second mode. In another instance, the CPU 110 may control the strong error detector 132 to operate in the first mode and to operate in the second mode during post-processing. In a further instance, the CPU 110 may control the strong error detector 132 to periodically operate in one of the first and second modes.

The strong error detector 132 may receive a plurality of check node messages Cji from the check node unit 134. The check node messages Cji may be messages transmitted from a plurality of check nodes CN1 through CNj included in the check node unit 134 to a plurality of variable nodes VN1 through VNi included in the variable node unit 133. The details will be described later.

The strong error detector 132 may determine occurrence or non-occurrence of a strong error based on the check node messages Cji and the channel reception values CHL1 through CHLi and may correct the channel reception values CHL1 through CHLi according to the determination result to produce corrected channel reception values CHL'1 through CHL'i. Hereinafter, a variable node having a strong error is referred to as a strong error node for convenience' sake in the description.

The strong error detector 132 may select one of the variable nodes VN1 through VNi and may determine whether a strong error has occurred in a selected variable node VN. In detail, the strong error detector 132 may select a variable node corresponding to the channel reception value CHL having the highest absolute value among the channel reception values CHL1 through CHLi. However, example embodiments of the inventive concepts are not restricted thereto.

For instance, the strong error detector 132 may select the variable node VN corresponding to the channel reception value CHL having an absolute value of 7. At this time, the selected variable node may have strong certainty or probability. In other words, the selected variable node may be a node where a strong error or strong correction has occurred. The strong correction is an opposite concept to the strong error and refers to a state where it is strongly certain that a decision value is correct.

Thereafter, the strong error detector 132 may determine whether the selected variable node VN is a strong error node or a strong correction node.

For example, the strong error detector 132 may determine that the strong error has occurred in the selected variable node VN, if the majority of the signs of the check node messages Cji input to the selected variable node VN are different from the sign of the channel reception value CHL corresponding to the selected variable node VN and the absolute value of the channel reception value CHL corresponding to the selected variable node VN is less than the sum of the check node messages Cji input to the selected variable node VN.

Likewise, the strong error detector 132 may determine that the strong error has not occurred in the selected variable node VN, if the majority of the signs of the check node messages Cji input to the selected variable node VN are the same as the sign of the channel reception value CHL corresponding to the selected variable node VN or the absolute value of the channel reception value CHL corresponding to the selected variable node VN is equal to or greater than the sum of the check node messages Cji input to the selected variable node VN.

Alternatively, the strong error detector 132 may include a lookup table which stores strong error information corresponding to the combinations of the check node messages Cji and the channel reception values CHL1 through CHLi and may determine occurrence or non-occurrence of the strong error based on the lookup table.

When the strong error detector 132 determines that the strong error has occurred in the selected variable node VN, the strong error detector 132 may correct the channel reception value CHL corresponding to the selected variable node VN to produce a corrected channel reception value CHL' corresponding to the selected variable node VN. When the strong error detector 132 determines that the strong error has not occurred in the selected variable node VN, the strong error detector 132 may output the channel reception value CHL corresponding to the selected variable node VN as the corrected channel reception value CHL' corresponding to the selected variable node VN.

The strong error detector 132 may correct the channel reception value CHL of a strong error node upon receiving the detection control signal DC and may not correct the channel reception value CHL of the strong error node when the detection control signal DC is not received.

The strong error detector 132 may perform correction by lowering the absolute value of the channel reception value CHL of the strong error node. For instance, when performing correction, the strong error detector 132 may subtract a correction value CV from the absolute value of the channel reception value CHL and set the subtraction result as the absolute value of the corrected channel reception value CHL'. At this time, the strong error detector 132 may receive the correction value CV from the CPU 110 and the correction value CV may have been set in advance. In other words, when it is determined that the strong error has occurred in the selected variable node VN, the strong error detector 132 may set the absolute value of the channel reception value CHL corresponding to the selected variable node VN less the correction value CV as the absolute value of the corrected channel reception value CHL' corresponding to the selected variable node VN and may set the sign of the channel reception value CHL as the sign of the corrected channel reception value CHL', thereby producing the corrected channel reception value CHL'. The correction value CV may be set to make the majority of the signs of variable node messages Vij corresponding to the selected variable node VN to be the same as the sign of the channel reception value CHL corresponding to the selected variable node VN. However, example embodiments of the inventive concepts are not restricted thereto.

Alternatively, when performing correction, the strong error detector 132 may set the corrected channel reception value CHL' of a strong error node to "0". In other words, when it is determined that a strong error has occurred in the selected variable node VN, the strong error detector 132 may correct the channel reception value CHL corresponding to the selected variable node VN into "0" to produce the corrected channel reception value CHL' corresponding to the selected variable node VN.

The variable node unit 133 may receive corrected channel reception values CHL'i from the strong error detector 132. The variable node unit 133 may also receive the check node messages Cji from the check node unit 134. The variable node unit 133 may include the plurality of the variable nodes VN1 through VNi. The number of the variable nodes VN1 through VNi may be "i", where "i" is a natural number. Similarly, the check node unit 134 may include the plurality of check nodes CN1 through CNj. The number of the check nodes CN1 through CNj may be "j".

The variable node unit 133 may perform a logical operation using the corrected channel reception values CHL'i and the check node messages Cji for the message exchange with the check node unit 134. The variable node unit 133 may generate the variable node messages Vij by performing the logical operation and may output the variable node messages Vij to the check node unit 134.

The check node unit 134 may perform a logical operation using the variable node messages Vij for the message exchange with the variable node unit 133. The check node unit 134 may generate the check node messages Cji by performing the logical operation and may output the check node messages Cji to the variable node unit 133.

The variable node unit 133 may perform the operation using Equations 1 and 2:

$$Mi = CHL'i + \Sigma Cji, \text{ for all } j \quad (1)$$

$$Vij = Q(Mi - Cji), \text{ for each } i, \quad (2)$$

where Mi is an intermediate parameter, CHL'i is a corrected channel reception value, $\Sigma$Cji is the sum of all check node messages received by the i-th variable node, and the Q function may be a quantization function of allocating one of desired (or, alternatively, predetermined) values according to an input.

For instance, the absolute value of the variable node messages Vij may be one of values in a set of [0, 1, . . . , LM], where LM is a natural number of at least 2. Similarly, the absolute value of the check node messages Cji may be one of the values in the set of [0, 1, . . . , LM]. When LM is 3, the absolute value of the variable node messages Vij and the check node messages Cji may be one of the values in a set of [0, 1, 2, 3]. Similarly to the channel reception value CHL, the absolute value of the variable node messages Vij and the check node messages Cji may have a higher value as the certainty or probability gets higher.

The variable node unit 133 may output the variable node messages Vij to the decision circuit 135. The decision circuit 135 may finally make a decision about the variable nodes VN1 through VNi based on the variable node messages Vij. However, example embodiments of the inventive concepts are not restricted thereto. Unlike what is illustrated in FIG. 7, the decision circuit 135 may finally make a decision about the variable nodes VN1 through VNi based on the check node messages Cji. According to the decision result, the decision circuit 135 may output a codeword CW having a length of "i".

Figure 8:
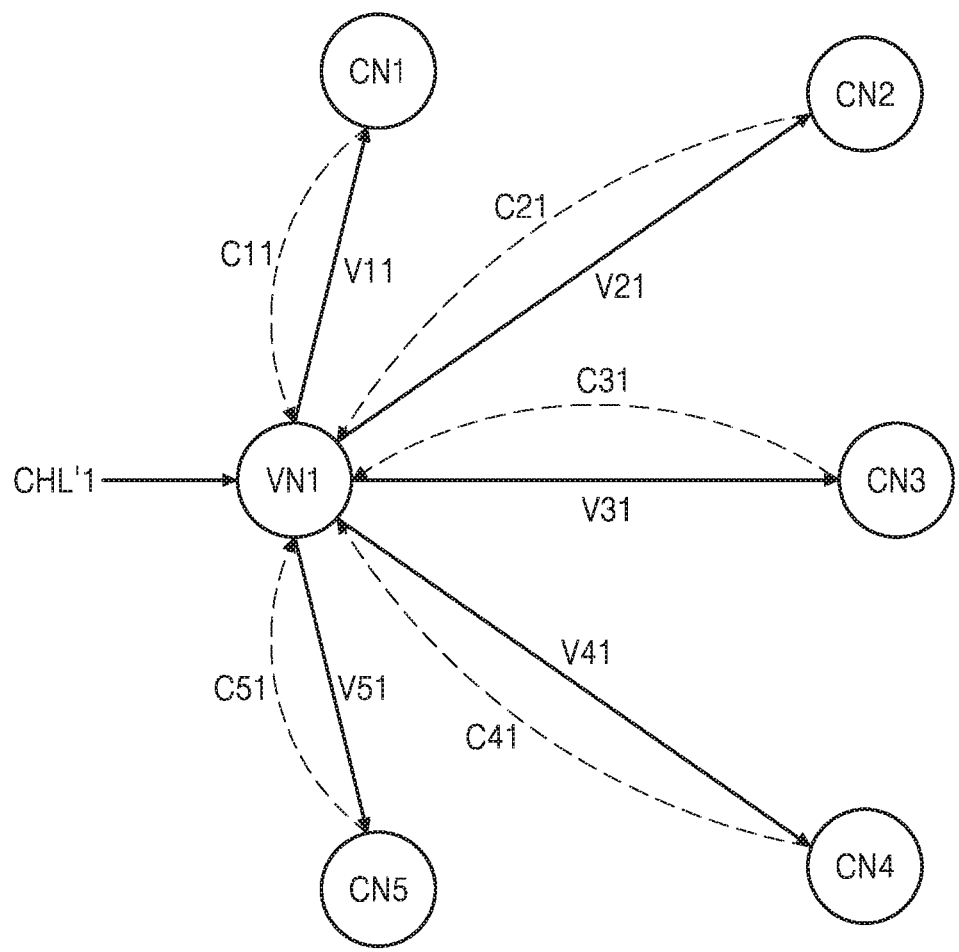
FIG. 8 is a diagram showing the message exchange of a variable node according to some example embodiments of the inventive concepts.

FIG. 8 is a diagram showing the message exchange of the variable node VN1 according to some example embodiments of the inventive concepts.

Referring to FIG. 8, the first variable node VN1 may exchanges messages with the first through fifth check nodes CN1 through CN5. It is assumed that the first variable node VN1 is a strong error node.

Message exchange of the variable node unit 133 in a case where a channel reception value of a strong error node is not corrected will be described first to explain the characteristics of example embodiments of the inventive concepts in detail.

(1) Case where the Channel Reception Value of the Strong Error Node is not Corrected.

It is assumed that the first channel reception value CHL'1 received by the first variable node VN1 is −7. This may mean that it is certain the value of a corresponding cell is i, as described above. It is also assumed that the check node messages C11 through C51 received by the first variable node VN1 are sequentially 3, 3, 3, −3, and 1. As described above, the first through third check node messages C11, C21, and C31 may mean that it is certain the value of the corresponding cell is 0.

When the absolute value of the first channel reception value CHL'1, i.e., 7 is relatively very high although the majority of check node messages indicate that it is certain the values of the corresponding cell is 0, the first variable node VN1 may generate a message indicating that the value of the corresponding cell is 1. In detail, the first variable node VN1 may calculate the first through third variable node messages V11 through V13 as −3, the fourth variable node message V14 as 1, and the fifth variable node message V15 as −1 using Equations 1 and 2. In other words, the first variable node VN1 may send wrong messages to the CN1 through CN5, so that error correction of an LDPC decoder may not operate normally. As a result, when the channel reception value of the strong error node is not corrected, the coding performance of the LDPC decoder may deteriorate.

(2) Case where the Channel Reception Value of the Strong Error Node is Corrected Based on the above assumption, it is assumed that the first corrected channel reception value CHL'1 received by the first variable node VN1 is −3. As described above, this may mean that the value of the corresponding cell is 1. At this time, the first corrected channel reception value CHL'1 may be obtained by the strong error detector 132 using the correction value CV of 4 received from the CPU 110, as illustrated in FIG. 7. It is also assumed that the check node messages C11 through C51 received by the first variable node VN1 are sequentially 3, 3, 3, −3, and 1. As described above, the first through third check node messages C11, C21, and C31 may mean that it is certain the value of the corresponding cell is 0.

The first variable node VN1 may calculate the first through third variable node messages V11 through V13 as 1, the fourth variable node message V14 as 3, and the fifth variable node message V15 as −1 using Equations 1 and 2. In other words, the first variable node VN1 generates many check node messages indicating 0 although the first channel reception value CHL'1 indicates that the value of the cell is 1, so that the error correction of the LDPC decoder may operate normally. Consequently, when the channel reception value of the strong error node is corrected, the coding performance of the LDPC decoder is increased.

Figure 9:
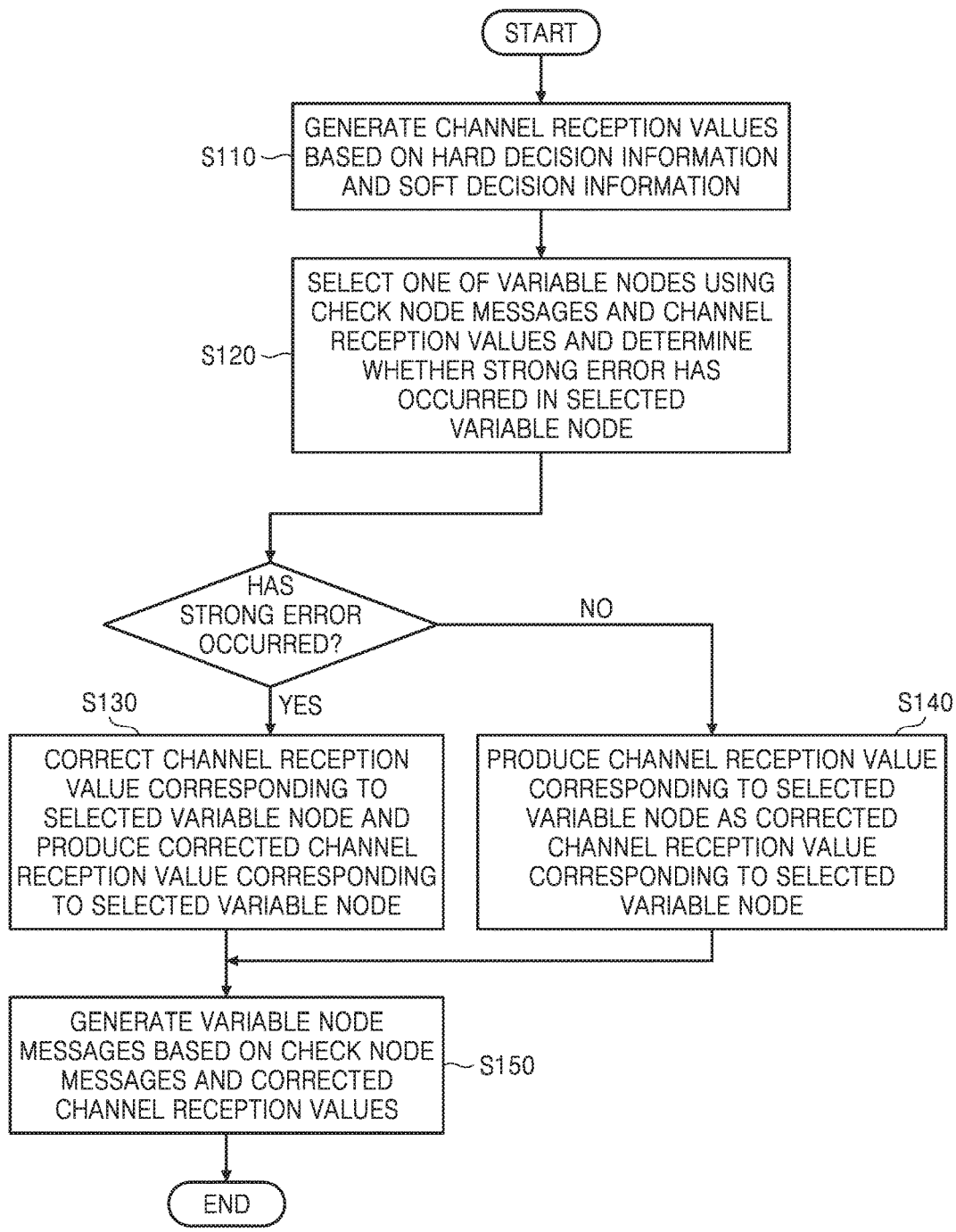
FIG. 9 is a flowchart of a method of operating a decoder according to some example embodiments of the inventive concepts.

FIG. 9 is a flowchart of a method of operating the decoder 130 according to some example embodiments of the inventive concepts.

Referring to FIGS. 1 through 9, in operation S110, the decoder 130 may generate the channel reception values CHL1 through CHLi based on the hard decision information HDI and the soft decision information SDI. The hard decision information HDI may include hard decision values of respective cells forming a page. The soft decision information SDI may include soft decision values of the respective cells forming the page. The channel reception values CHL1 through CHLi may respectively correspond to the cells forming the page. The sign of each of the channel reception values CHL1 through CHLi may be determined by a hard decision value and the absolute value thereof may be determined by a soft decision value.

In operation S120, the decoder 130 may select one of variable nodes using the check node messages Cji and the channel reception values CHL1 through CHLi, and the decoder 130 may determine whether a strong error has occurred in the selected variable node VN.

In operation S130, the decoder 130 may correct the channel reception value CHL corresponding to the selected variable node VN to produce the corrected channel reception value CHL' corresponding to the selected variable node VN, if the decoder 130 determines that the strong error has occurred in the selected variable node VN.

In operation S140, the decoder 130 may not correct the channel reception value CHL corresponding to the selected variable node VN but may produce the channel reception value CHL as the corrected channel reception value CHL' corresponding to the selected variable node VN, if the decoder 130 determines that the strong error has not occurred in the selected variable node VN.

In operation S150, The decoder 130 may generate the variable node messages Vij using the check node messages Cji and the corrected channel reception values CHL'1 through CHL'i.

Figure 10:
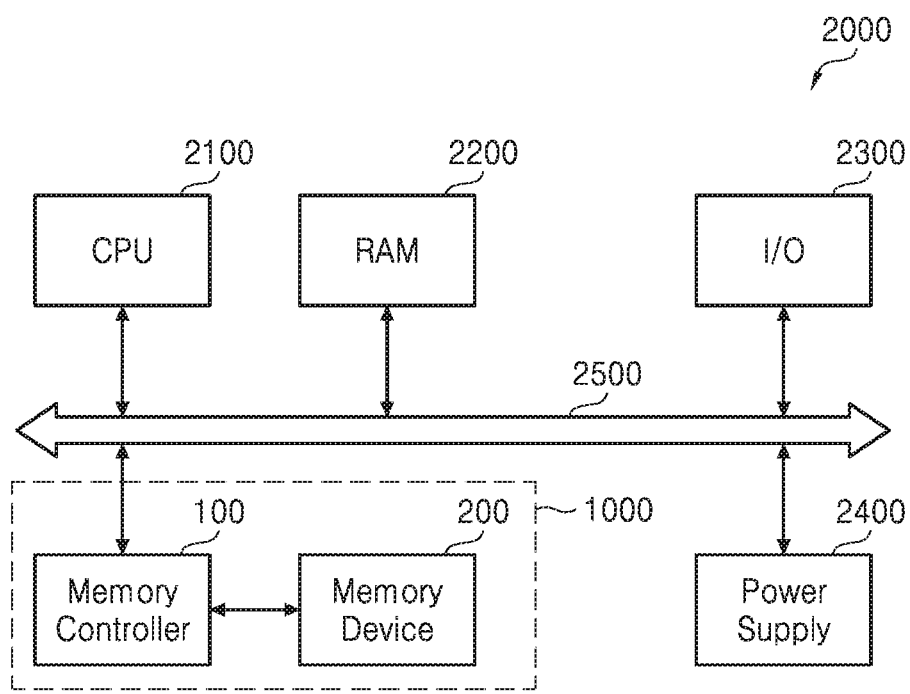
FIG. 10 is a block diagram of an electronic device using a memory system according to some example embodiments of the inventive concepts.

FIG. 10 is a block diagram of an electronic device 2000 using the memory system 1000 according to some example embodiments of the inventive concepts.

Referring to FIG. 10, the electronic device 2000 may include a processor 2100, a RAM 2200, an input/output (I/O) device 2300, a power supply 2400, and the memory system 1000. Although not shown in FIG. 10, the electronic device 2000 may also include ports that can communicate with video cards, sound cards, memory cards, universal serial bus (USB) devices, or other electronic devices. The electronic device 2000 may be implemented as a personal computer (PC) or a portable electronic device such as a notebook computer, a mobile phone, a personal digital assistant (PDA), or a camera.

The memory system 1000 illustrated in FIGS. 1 and 2 may be used as the memory system 1000 illustrated in FIG. 10. Accordingly, the memory controller 100 may decode data read from the memory device 200 using an LDPC decoding method according to some example embodiments of the inventive concepts.

The processor 2100 may perform particular calculations or tasks. The processor 2100 may be a microprocessor or a CPU. The processor 2100 may communicate with the RAM 2200, the I/O device 2300, and the memory system 1000 through a bus 2500 such as an address bus, a control bus, or a data bus. The processor 2100 may also be connected to an extended bus such as a peripheral component interconnect (PCI) bus.

The RAM 2200 may store data necessary for the operations of the electronic device 2000. The RAM 2200 may be implemented as DRAM, mobile DRAM, SRAM, PRAM, FRAM, resistive RAM (RRAM) and/or MRAM.

The I/O device 2300 may include an input device such as a keyboard, a keypad, or a mouse and an output device such as a printer or a display. The power supply 2400 may provide an operating voltage necessary for the operation of the electronic device 2000.

Figure 11:
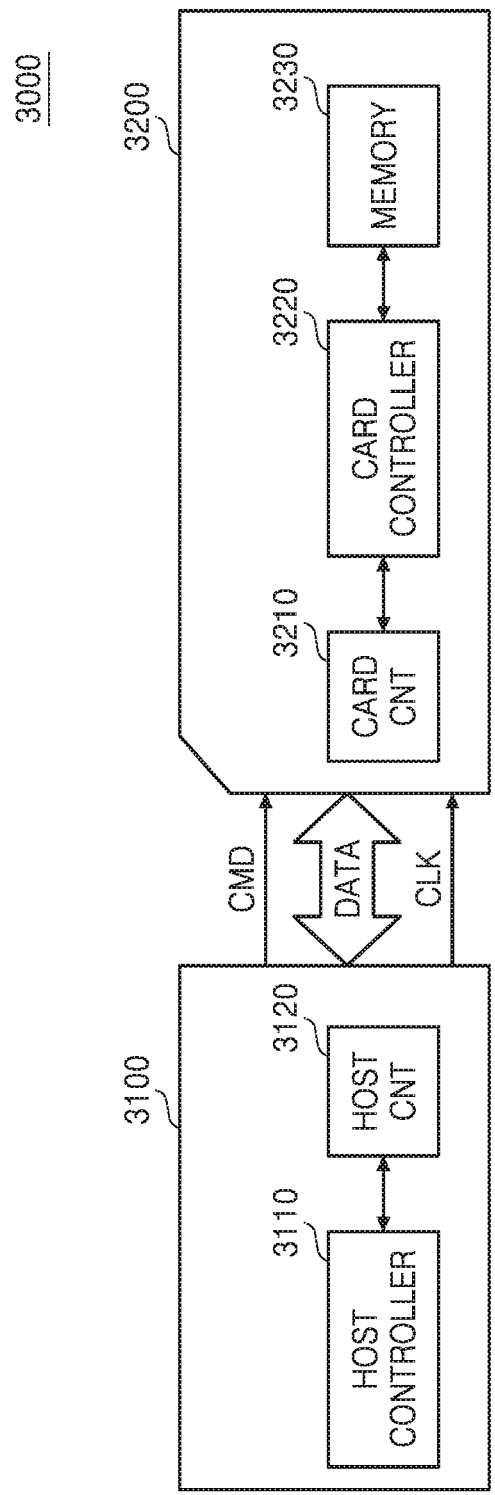
FIG. 11 is a block diagram of a memory card system using a memory system according to some example embodiments of the inventive concepts.

FIG. 11 is a block diagram of a memory card system 3000 using a memory system according to some example embodiments of the inventive concepts.

Referring to FIG. 11, the memory card system 3000 may include a host 3100 and a memory card 3200. The host 3100 may include a host controller 3110 and a host connector 3120. The memory card 3200 may include a card connector 3210, a card controller 3220, and a memory device 3230. The memory controller 100 and the memory device 200 illustrated in FIG. 1 or 2 may be used as the card controller 3220 and the memory device 3230 illustrated in FIG. 11.

The host 3100 may write data to the memory card 3200 and may read data from the memory card 3200. The host controller 3110 may transmit a command CMD, a clock signal CLK generated by a clock generator (not shown) included in the host 3100, and data to the memory card 3200 via the host connector 3120.

The card controller 3220 may decode data read from the memory device 3230 using an LDPC decoding method using efficient scheduling according to some example embodiments of the inventive concepts in response to a command received via the card connector 3210. The memory card 3200 may be implemented as a compact flash card (CFC), a microdrive, a smart media card (SMC), a multimedia card (MMC), a secure digital card (SDC), a memory stick, or a USB flash memory driver.

Figure 12:
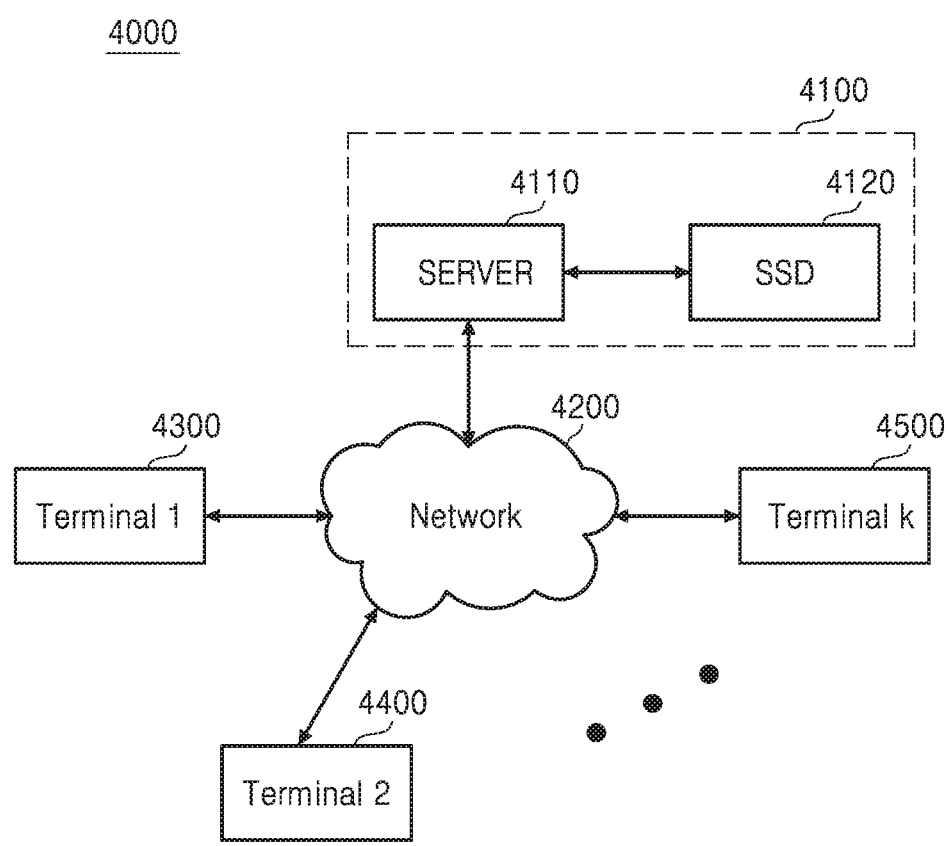
FIG. 12 is a block diagram of a network for a server system including a solid state drive (SSD) according to some example embodiments of the inventive concepts.

FIG. 12 is a block diagram of a network system 4000 according to some example embodiments of the inventive concepts.

Referring to FIG. 12, a network system 4000 may include the server system 4100 and a plurality of terminals 4300, 4400, and 4500, which are connected to one another via the network 4200.

The server system 4100 may include a server 4110 which processes requests received from the terminals 4300, 4400, and 4500 connected to the network 4200, and an SSD 4120 which stores data corresponding to the requests received from the terminals 4300, 4400, and 4500. The memory system 1000 illustrated in FIG. 1 or 2 may be used as the SSD 4120.

A memory system according to some example embodiments of the inventive concepts may be installed using various types of packages such as package on package (PoP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline integrated circuit (SOIC), a shrink small outline package (SSOP), a thin small outline package (TSOP), a system in package (SIP), a multi chip package (MCP), a wafer-level fabricated package (WFP), and a wafer-level processed stack package (WSP).

As described above, according to some example embodiments of the inventive concepts, a decoder and a memory controller including the same correct a channel log-likelihood ratio (LLR) of a variable node having a strong error, thereby increasing error correction performance and reliability.

While example embodiments of the inventive concepts has been particularly shown and described with reference to some example embodiments thereof, it will be understood by those of ordinary skill in the art that various changes in forms and details may be made therein without departing from the spirit and scope of the example embodiments of the inventive concepts as defined by the following claims.

What is claimed is:

1. A decoder comprising:
a processing circuitry configured to,
   generate a plurality of channel reception values by,
     determining absolute values based on soft decision information, and
     determining whether each of the plurality of channel reception values is positive or negative based on hard decision information;
   determine whether an error is present using a plurality of check node messages and the plurality of channel reception values, and
   decrease a channel reception value associated with the error to produce corrected channel reception values, in response to determining that the error is present.

2. The decoder of claim 1, further comprising:
a plurality of variable nodes configured to generate a plurality of variable node messages using the check node messages and the corrected channel reception values; and a plurality of check nodes configured to generate the check node messages using the variable node messages.

3. The decoder of claim 2, wherein the processing circuitry is configured to,
select one of the variable nodes,
determine that the error is present in the selected variable node, if (i) a majority of signs of the check node messages input to the selected variable node are different from a sign of a channel reception value corresponding to the selected variable node and (ii) an absolute value of the channel reception value corresponding to the selected variable node is less than a sum of check node messages input to the selected variable node, and
determine that the error is not present in the selected variable node, if the majority of the signs of the check node messages input to the selected variable node are same as the sign of the channel reception value corresponding to the selected variable node.

4. The decoder of claim 3, wherein the processing circuitry is configured to,
correct the channel reception value corresponding to the selected variable node to produce a corrected channel reception value corresponding to the selected variable node, if the error is present in the selected variable node, and
maintain the channel reception value corresponding to the selected variable node by assigning the channel reception value as the corrected channel reception value corresponding to the selected variable node, if the error is not present in the selected variable node.

5. The decoder of claim 4, wherein the processing circuitry is configured to,
set a value obtained by subtracting a correction value from the absolute value of the channel reception value corresponding to the selected variable node as an absolute value of the corrected channel reception value corresponding to the selected variable node, if the error is present in the selected variable node, and
set a sign of the channel reception value as a sign of the corrected channel reception value to produce the corrected channel reception value.

6. The decoder of claim 5, wherein the processing circuitry is configured to set the correction value such that a majority of signs of the variable node messages corresponding to the selected variable node have a same as the sign of the channel reception value corresponding to the selected variable node.

7. The decoder of claim 4, wherein the processing circuitry is configured to correct the channel reception value corresponding to the selected variable node to a value of 0 to produce the corrected channel reception value corresponding to the selected variable node, if the error is present in the selected variable node.

8. The decoder of claim 2, wherein further comprising:
a memory configured to store a lookup table containing error information corresponding to combinations of the check node messages and the channel reception values and, wherein
the processing circuitry is configured to determine whether the error is present based on the lookup table.

9. The decoder of claim 2, further comprising:
a decision circuit configured to output a decoded codeword based on the variable node messages.

10. The decoder of claim 2, wherein the plurality of variable nodes calculate the variable node messages using Equations 1 and 2:

$$Mi=CHL'i+\Sigma Cji, \text{ for all } j \quad (1)$$

$$Vij=Q(Mi-Cji), \text{ for each } i, \quad (2)$$

where $Mi$ is an intermediate parameter, $CHL'i$ is a corrected channel reception value, $Cji$ is the check node messages, $Q$ is a quantization function of allocating values according to an input, and $Vij$ is the variable node messages.

11. A memory controller comprising:
a decoder configured to program data to a memory device, the decoder configured to,
generate a plurality of channel reception values by determining absolute values based on soft decision information and by determining whether each of the plurality of channel reception values is positive or negative based on hard decision information,
determine whether an error is present using a plurality of check node messages and the plurality of channel reception values, and
decrease a channel reception value associated with the error to produce corrected channel reception values, in response to determining that the error is present; and
a central processing unit (CPU) configured to instruct the decoder to operate in one of a first mode and a second mode, the first mode being a mode in which the decoder performs correction and the second mode being a mode in which the decoder does not perform the correction.

12. The memory controller of claim 11, wherein the decoder further comprises:
a plurality of variable nodes configured to generate a plurality of variable node messages using the check node messages and the corrected channel reception values; and
a plurality of check nodes configured to generate the check node messages using the variable node messages.

13. The memory controller of claim 11, wherein the CPU is configured to control the decoder to operate in the first mode for a period of time and then operate in the second mode.

14. The memory controller of claim 11, wherein the CPU is configured to control the decoder to operate in the first mode and to operate in the second mode during post-processing.

15. The memory controller of claim 11, wherein
the CPU is configured to output a detection control signal to the decoder, and
wherein the decoder is configured to perform the correction according to the detection control signal, and to periodically switch between the first mode and second mode.

16. A decoder comprising:
a processing circuitry configured to,
generate a plurality of channel reception values by determining absolute values based on soft decision information and by determining whether each of the plurality of channel reception values is positive or negative based on hard decision information,
detect an error node among a plurality of variable nodes, each of the plurality of variable nodes having each of the plurality of channel reception values, and decrease the channel reception value associated with the error node to produce corrected channel reception value, in response to detecting the error node.

17. The decoder of claim 16, wherein the processing circuitry is configured to detect the error node based on the channel reception value associated with the error node and check node messages input thereto, the channel reception value associated with the error node being a log likelihood ratio (LLR).

18. The decoder of claim 17, wherein the processing circuitry is configured to detect which of the plurality of variable nodes is the error node based on which of the plurality of variable nodes has (i) a majority of signs of the check node messages that differ from a sign of the channel reception value associated with a respective one of the plurality of variable nodes, and (ii) an absolute value of the channel reception value associated with the respective one of the plurality of variable nodes that is less than a sum of the check node messages input thereto.

19. The decoder of claim 18, wherein the processing circuitry is configured to correct the channel reception value associated with the error node by decreasing the absolute value of the channel reception value associated with the error node by an amount such that the majority of the signs of the check node messages are same as the sign of the channel reception value associated with the error node.

* * * * *